United States Patent [19]

Takada et al.

[11] Patent Number: 4,547,260

[45] Date of Patent: Oct. 15, 1985

[54] PROCESS FOR FABRICATING A WIRING LAYER OF ALUMINUM OR ALUMINUM ALLOY ON SEMICONDUCTOR DEVICES

[75] Inventors: Tadakazu Takada, Kawasaki; Katsunori Shimizu, Tokyo, both of Japan

[73] Assignee: Fujitsu Limited, Kawasaki, Japan

[21] Appl. No.: 598,741

[22] Filed: Apr. 10, 1984

[30] Foreign Application Priority Data

Apr. 13, 1983 [JP] Japan .................. 58-64719

[51] Int. Cl.$^4$ .................. C23F 1/02; B44C 1/22; C03C 15/00; C03C 25/06

[52] U.S. Cl. .................. 156/643; 156/646; 156/651; 156/656; 156/659.1; 156/665; 156/345; 204/192 E; 252/79.1

[58] Field of Search .......... 156/643, 646, 651, 656, 156/659.1, 665, 345; 252/79.2, 79.1; 204/164, 192 E, 298; 427/38, 39

[56] References Cited

U.S. PATENT DOCUMENTS

| | | | |
|---|---|---|---|
| 4,267,013 | 5/1981 | Iida et al. ............... | 156/646 X |
| 4,325,984 | 4/1982 | Galfo et al. ............. | 156/646 X |
| 4,380,488 | 4/1983 | Reichelderfer ........... | 156/651 X |
| 4,412,885 | 11/1983 | Wang et al. ............. | 156/643 |

Primary Examiner—William A. Powell
Attorney, Agent, or Firm—Staas & Halsey

[57] ABSTRACT

In the fabrication of an aluminum or aluminum alloy wiring layer on a semiconductor device by dry etching using a gas containing chlorine species, a plasma exposure step inserted into the dry etching process in order to avoid the problems due to using a chlorine radical etchant. One half thickness of the aluminum layer, which is selectively masked by a resist mask film, on a semiconductor substrate is etched by a reactive ion etching technique using an etchant gas composed of $CCl_4+BCl_3$, and then exposed to a plasma of a gas composed of $CF_4+O_2$ generated by RF power. After the plasma exposure, the remaining thickness of the aluminum film is etched off under the same conditions as in the preceeding reactive ion etching. As the result, the amount of side etching is reduced to one half that of the case without the plasma exposure step, and corrosion originating from aluminum chlorides, products of the reactive ion etching, is eliminated. And further, the residual polysilicon layer, which is usually formed when Al-Si film is etched by using a gas containing chlorine as a reactive species, is also reduced.

24 Claims, 12 Drawing Figures

PROCESS FOR FABRICATING A WIRING LAYER OF ALUMINUM OR ALUMINUM ALLOY ON SEMICONDUCTOR DEVICES

TECHNICAL BACKGROUND OF THE INVENTION

The present invention relates to a patterning process for the wiring layer of semiconductor devices, and more particularly to a dry etching process for a thin film aluminum or aluminum alloy.

A thin film of aluminum or aluminum alloy (hereinafter both terms will be represented by aluminum) is generally used for the wiring layer of semiconductor devices including ICs (Integrated Circuits) and LSI (Large Scale Integration) circuits.

Modern manufacturing of ICs of LSIs, employs dry etching, and especially dry etching using reactive gas species. For example, reactive plasma etching or reactive ion etching have become indispensable in fabricating circuit lines and islands having dimensions of a micron or submicron. In structures such as these, side etching is required to be less than a few tenths of a micron for a layer having a thickness of around 1 micron.

In dry etching of an aluminum film, a gas containing chlorine species is usually employed as the etchant because of its higher etching rate for aluminum compared to other etchant gases containing different reactive species, for example, fluorine. FIG. 1 is a schematic cross-sectional diagram illustrating the etching mechanism of an aluminum film by active chlorine atoms (chlorine radicals; Cl*). In the figure, an aluminum film 1 is formed on an insulating layer 2 which is formed on a semiconductor substrate (not shown). The aluminum film is selectively masked by a resist mask film 3, such as ordinary photoresist. At the unmasked portion of the aluminum film, incident ions containing chlorine species (Cl+, CCl$_3$+, etc.) and/or chlorine radicals (Cl*) react with the aluminum film 1 to form volatile aluminum compounds, such as aluminum chloride (AlCl$_x$, where x is considered to be 1, 2 or 3). Since such aluminum chloride compounds are easily removed from the surface of the aluminum film 1 by the thermal agitation or by the bombardment of the incident ions, etching at a higher speed can be maintained. At the same time, side etch, i.e., etching in a lateral direction, takes place under the masked portion of the aluminum film 1 (such side etching is also called under-cut) The side etch shown in the drawings is emphasized.

In the conventional dry etching technique, highly delicate and complicated process control is needed to keep the side etch within the required range mentioned above. The factors to be controlled include the pressure and flow rate of the etchant gas and its composition, the input power for generating plasma, etc. These factors must be tuned individually for each etching system. If the etching conditions are not sufficiently maintained, a large amount of side etch occurs. This side etching often extends under the masked portion of the aluminum film, and completely under-cuts the masked portion before the unmasked portion of the layer is etched off. In other words, such a difficulty in the control of the processing conditions for the dry etching process is one of the causes of poor yields and reduced operational reliability of the devices due to the wiring line being thinned by side etching, which causes burnout failure during field operations.

Side etching is considered to result from the adsorption of the chlorine radicals (Cl*) on sidewall surfaces of tne aluminum film. That is, the chlorine radicals (Cl*) are electrically neutral and able to move independently of the electrical field accompanying the radio frequency power used to generate a plasma for the etching. Therefore, the chlorine radicals can easily diffuse in the lateral direction to reach the sidewall and then attack it to etch it away.

Another problem involved in the conventional dry etching of aluminum film is the production of a number of defects such as a vermicular pattern developed on the surface of the aluminum film, as illustrated in FIG. 2. Such a defect occurs when an aluminum layer, which has been dry etched using a gas containing chlorine species is exposed in the air. This defect is considered to be caused by corrosion of the aluminum film by hydrochloric acid. As described before, aluminum chloride is formed during dry etching and adsorbed on the resist mask film 3. Because the aluminum chloride is strongly hygroscopic and forms hydrochloric acid (HCl), as soon as it absorbs the moisture in the air. The hydrochloric acid penetrates the resist mask film 3, and then corrodes the surface of the aluminum film 1 lying under the resist mask film 3. This corrosion does not occur uniformly over the surface so that the vermicular pattern results. This corrosion decreases the effective cross-section of the aluminum wiring line and increases its resistivity. This eventually leads to burnout of the wiring line when an electric current is applied to the wiring line.

Furthermore, when an aluminum-silicon alloy film is used as the wiring layer, silicon accumulates on the surface of the etched portion of the aluminum film. FIG. 3 is a schematic cross-sectional diagram illustrating a residual polysilicon layer 31 formed on the unmasked portion of the aluminum-silicon alloy film 32 during dry etching. In FIG. 3, reference numerals 2 and 3 designate elements corresponding to those in FIG. 1. The residual polysilicon layer 31 causes a short circuit between wiring lines.

The accumulation of polysilicon is due to the different etching rates of aluminum and silicon, and to the chlorine radicals. The etching rate of silicon by the chlorine radical is less than that of aluminum. Therefore, when the polysilicon layer 31 is formed on the surface, the apparent etching rate of the aluminum-silicon alloy film 32 using the chlorine radical decreases. Accordingly, extensive time or higher input power is needed to etch the entire thickness of the aluminum-silicon alloy film 32. This results in increased side etching or under-cut.

SUMMARY OF THE INVENTION

It is a primary object of the present invention to prevent side etching of an aluminum or aluminum alloy wiring layer formed on a semiconductor devices when dry etching the wiring layer using a gas containing chlorine species.

It is another object of the present invention to prevent corrosion of an aluminum or aluminum alloy wiring layer formed on a semiconductor device when dry etching the wiring layer using a gas containing chlorine species.

It is further another object of the present invention to provide a high precision aluminum or aluminum alloy wiring layer for a semiconductor device.

It is still another object of the present invention to provide a high reliability aluminum or aluminum alloy wiring layer for a semiconductor device.

It is yet another object of the present invention to provide an aluminum or aluminum alloy wiring layer which can be used on semiconductor devices such as ICS and LSI circuits.

The above objects can be accomplished by introducing a step of a plasma exposure to the process for fabricating an aluminum or aluminum alloy wiring layer on a semiconductor device. The plasma used in the exposure process is generated from discharge in a gas containing fluorine species. The substrate carrying the aluminum wiring layer is sequentially exposed to the plasma during interruptions in the dry etching process using a gas containing chlorine species.

Other objects, features and advantages of the present invention will be apparent from the following description together with the accompanying drawings.

PREFERRED EMBODIMENT OF THE INVENTION

Figure 1:
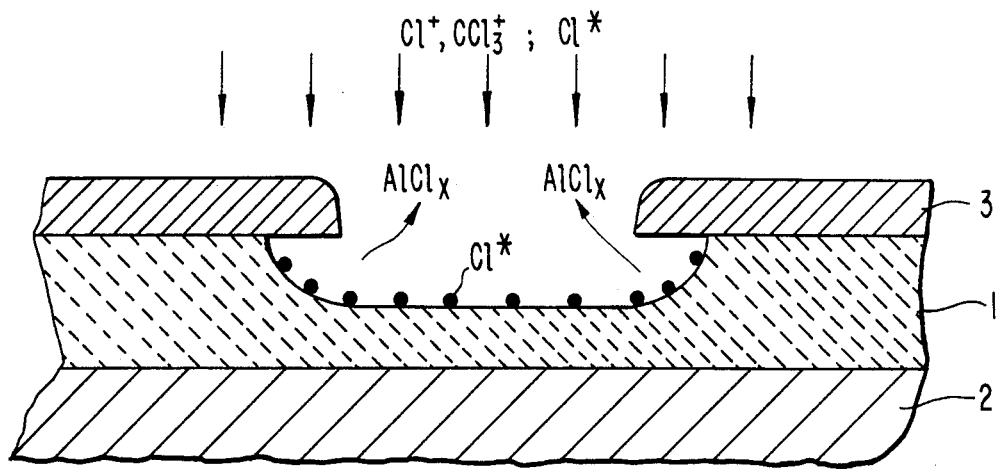
FIG. 1 is a cross-sectional diagram illustrating a mechanism of etching an aluminum film using chlorine radicals (Cl*)
Figure 2:
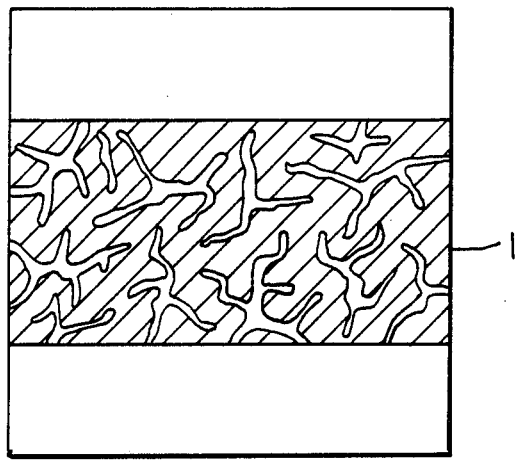
FIG. 2 illustrates a vermicular pattern developed on the surface of an aluminum film.
Figure 3:
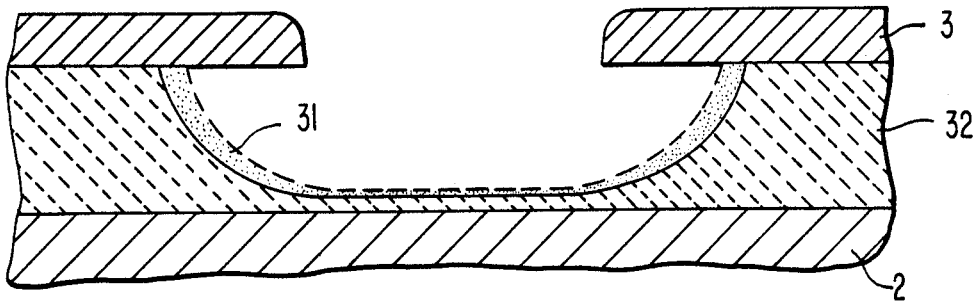
FIG. 3 is a cross-sectional diagram illustrating a polysilicon residual layer formed on the unmasked portion of the aluminum-silicon alloy film during dry etching.
Figure 4A:
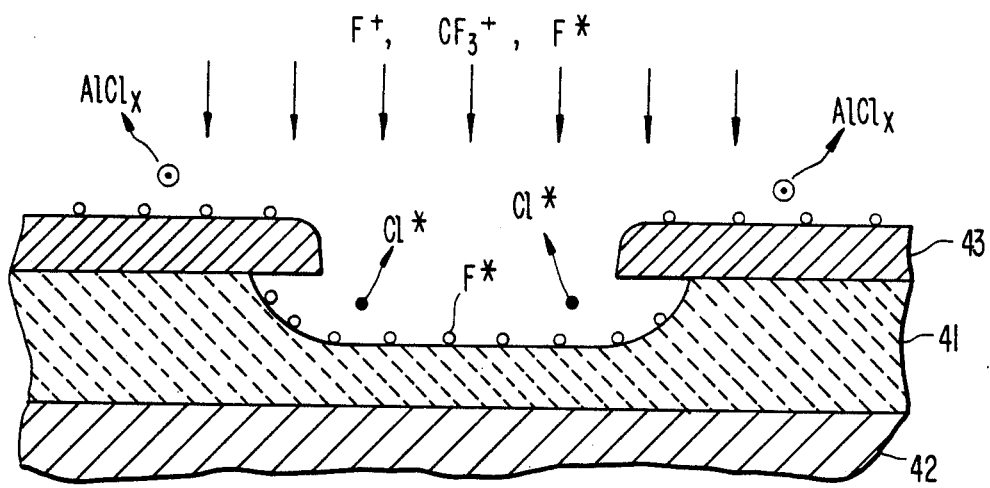
FIGS. 4(A) and 4(B) are cross-sectional diagrams respectively illustrating substitution of fluorine radicals (F*) for adsorbed chlorine radicals, and the reduction of side etching by introducing a plasma exposure process of the present invention.
Figure 4B:
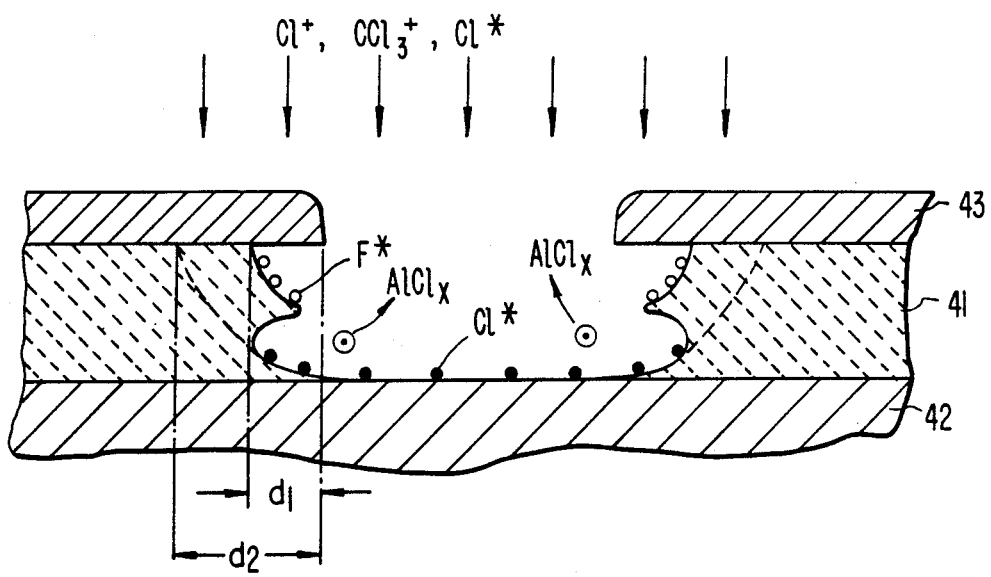

FIGS. 4(A) and 4(B) illustrate the effects of the present invention. In FIG. 4(A), about one half of the thickness of the unmasked portion of aluminum film 41, formed on an insulator layer 42, has been dry-etched using an etchant gas containing chlorine species; This manufacturing stage results from what is referred to as the first dry etching. After the first dry etching, the aluminum film 41 is exposed to a plasma of a gas containing fluorine species. During this plasma exposure process, chlorine radicals (Cl*, denoted in FIG. 4 by filled circles), which were adsorbed on the surfaces of the unmasked portion of aluminum film 41 and a resist film 43 during the first dry etching process, are replaced by fluorine radicals (F*, denoted in FIG. 4 by blank circles). At the same time, aluminum chloride molecules (AlCl$_x$, denoted in FIG. 4 by dotted circles), which were adsorbed on the surface of the resist film 43, are also removed by the bombardment of the incident fluoride ions.

Since fluorine when reacting with the aluminum film 4, does not form a highly volatile compound such as aluminum chloride, the amount of reactive etching of the aluminum film 41 during the plasma exposure is very small. Therefore, the surface of the aluminum film 41 is densely covered with the adsorbed fluorine radicals.

After the plasma exposure process, the rest of the aluminum film 41, at the unmasked portion, is etched. This is referred to as the second dry etching. The second dry etching uses the same etchant gas containing chlorine species as used in the first dry etching.

In the second dry etching as shown in FIG. 4(B), the sidewall, formed during the first dry etching, is protected by the layer of the adsorbed fluorine radicals from etching by the incident chlorine radicals. This protection results from two factors. The first factor is that the sidewall is partially shielded, by the resist film 43, from ion bombardment. The second factor is that the fluorine radicals adsorbed on the sidewall are not replaced by incident chlorine radicals because of the larger binding energy between fluorine and aluminum than between chlorine and aluminum. On the other hand, the adsorbed fluorine radicals are removed from the surface subject to bombardment of chlorine ions, because the chlorine ions have enough energy to remove the fluorine radicals. Thus, the etching by chlorine radicals proceeds only at the surface subjected to chlorine ion bombardment. Consequently, the remainder of the aluminum film 41 is etched off by the chloride radical etchant.

Because the chlorine ion bombardment is anisotropic, the second dry etching delineates the pattern defined by the resist film 43. The second dry etching causes side etching of the remaining half of the aluminum film 41. The side etching during the second dry etching is very similar to that occurring during the first dry etching; that is, the side etching occurs in the region underneath the surface masked by the layer of adsorbed fluorine radicals as shown in FIG. 4(B).

It is easily understood that the amount of side etching (the maximum depth of the undercut) occurring during each of the first and the second dry etchings is less than that occurring in the conventional dry etching which is not interrupted by the plasma exposure step. That is, when the plasma exposure is utilized just after half of the aluminum film 41 is etched off, the amount of side etching ($d_1$) is nearly half of that occurring in the conventional dry etching ($d_2$), as shown in FIG. 4(B). In FIG. 4(B) the broken line indicates the side etch profile of the conventional dry etching process. If the plasma exposure step is carried out after one third and again after two thirds of the aluminum film 41 is etched, the amount of the side etching is nearly one third of that occurring in the conventional dry etching.

Details of an embodiment of the present invention are discussed below with reference to FIGS. 5(A) to 5(F). These figures are cross-sectional views of an embodiment of this invention. Also, FIG. 6 is a schematic diagram of a reactive ion etching system used in an embodiment of the present invention.

Figure 5A:
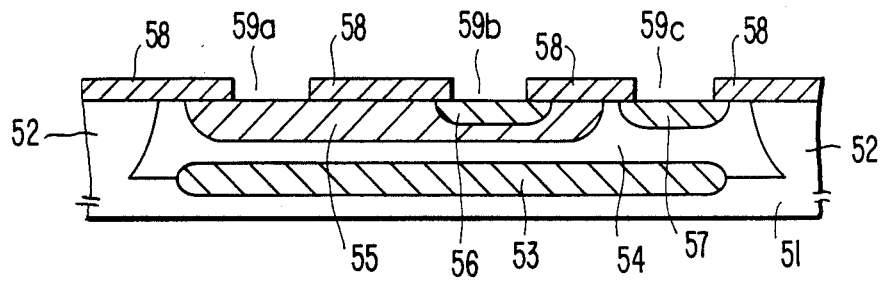
FIG. 5(A) to 5(F) are cross-sectional diagrams showing an application of the present invention to the various steps in the manufacturing process of a bipolar IC.

In the following, a process for producing a bipolar IC is employed as an example process embodying the present invention. In applying the present invention to fabricating a wiring layer of a bipolar IC, a semiconductor substrate having the functional elements shown in FIG. 5(A) is prepared according to a conventional manufacturing process. In FIG. 5(A), each reference numeral designates a part as follows: 51 denotes a silicon substrate, 52 indicates an isolation region, 53 designates a buried diffusion layer, 54 refers to a collector region, 55 identifies a base region 56 designates an emitter region, 57 denotes a collector contact region, 58 denotes a silicon dioxide ($SiO_2$) insulating layer, and 59a through 59b to 59c denote electrode contact holes.

Figure 5B:
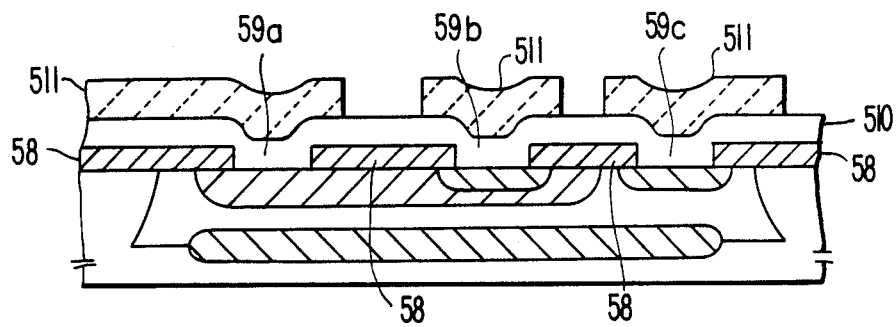

As shown in FIG. 5(B), an aluminum film 510 having a thickness of about 1 micron is formed on the FIG. 5(A) structure by using a conventional vacuum deposition or a sputtering technique. Then a resist mask film 511 is formed on the aluminum film 510 via a conventional photoprocess. The resist mask film 511 may be either a negative type or a positive type.

Figure 6:
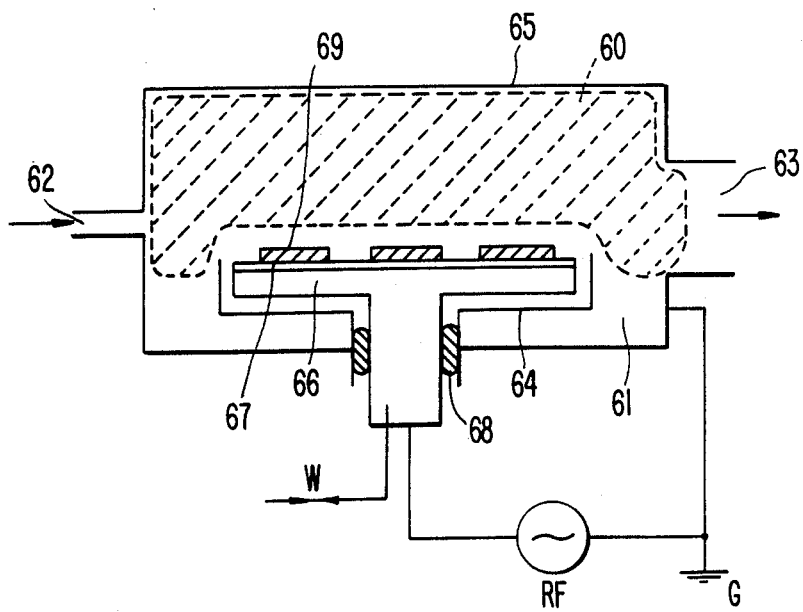
FIG. 6 is a schematic diagram of a dry etching system used in an embodiment of the present invention.

The substrate is then placed in a reactive ion etching system such as shown in FIG. 6. In FIG. 6, each reference numeral designates a part as follows: 61 designates an etching chamber, 62 identifies a gas inlet pipe, 63 notes a vacuum exhausting pipe, 64 denotes a shield plate, 65 designates an anode, 66 identifies a cathode, 67 designates a susceptor, 68 identifies an insulator, 69 identifies a substrate to be processed, and 60 denotes a plasma. Reference letters RF, G and W indicate a high frequency oscillator (13.56 MHz, for instance), ground, and a water cooling mechanism, respectively.

After the substrate is placed in the ion etching system, a gas mixture comprising carbon tetrachloride ($CCl_4$) and boron trichloride ($BCl_3$) is introduced into the etching chamber 61. The content and the flow rate of the mixed gas is controlled to be substantially the same as normally used in dry etching of aluminum. Also, the pressure in the etching chamber 61 is maintained at a conventional value, by controlling the gas exhausting rate. A typical value for the $CCl_4/BCl_3$ ratio is 1/5 and a typical pressure is 0.1 Torr. Then, 13.56 MHz radio frequency power of about 400 W is supplied between the anode 65 and cathode 66.

Figure 5C:
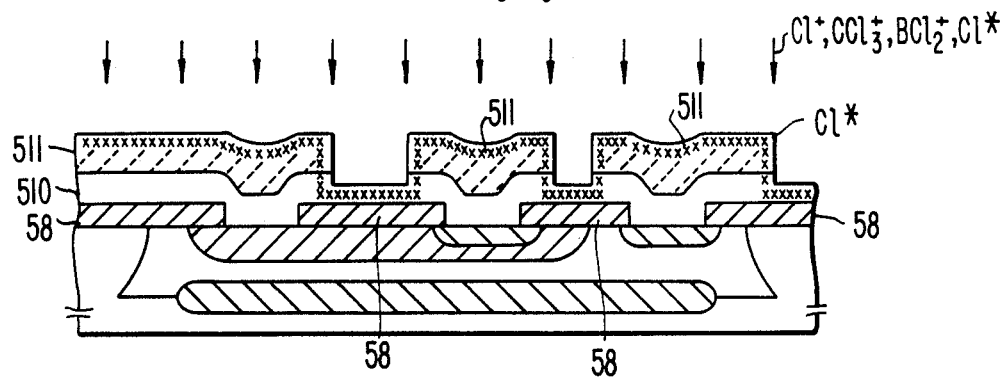

Under the above conditions, an unmasked portion of the aluminum film 510 is subject to reactive ion etching, and about 0.5 to 0.6 micron of the film (equivalent to about one half of the thickness of the film), is etched off, resulting in the structure shown in FIG. 5(C). The time required for this etching step is about 4 to 5 minutes. The above dry etching step is referred to as the first reactive ion etching.

After the first reactive ion etching has been finished, the surfaces of the etched portion of the aluminum film 510, and of the resist mask film 511 contain adsorbed active chlorine atoms (Cl*). Next, the gas in the etching chamber 61 is replaced by another gas mixture comprising carbon tetrafluoride ($CF_4$) and oxygen ($O_2$) at a pressure of about 0.3 Torr; the content of the oxygen being, for example, about 10 to 20%. Then radio frequency power of about 300 W is supplied for about 120 seconds. As a result, a plasma containing active fluorine species is generated, and the surface of the substrate; that is, the surfaces of the resist mask film 511 and of the unmasked portion of the aluminum film 510 are exposed to the plasma. The addition of $O_2$ to $CF_4$ enchances the efficiency of the plasma exposure. This is because $O_2$ reduces the recombination between the fluoride radicals and fragments of $CF_4$, such as $CF_3$*, and increases the (F*) radical concentration.

Figure 5D:
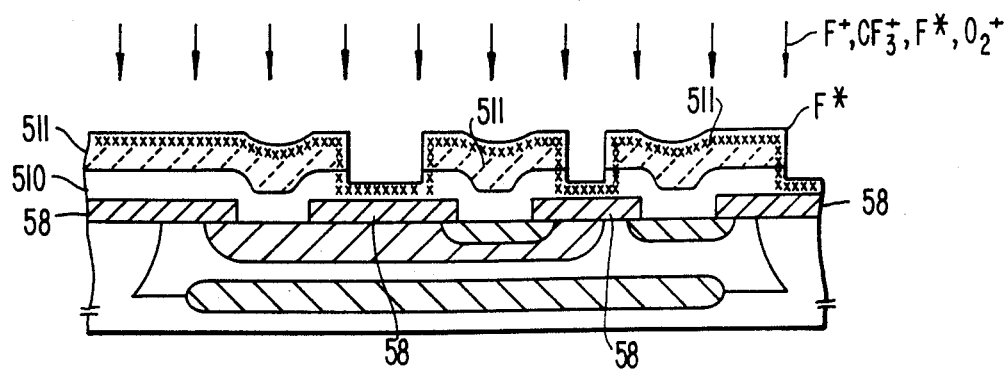

With this exposure to the plasma, the chlorine radicals (Cl*) adsorbed on the surfaces of tne resist mask film 511 and of the aluminum film 510 are removed. In their place, fluorine radicals (F*) are adsorbed on the surface of the resist mask film 511 and of the etched surface of the aluminum film 510 as shown in FIG. 5(D).

Figure 5E:
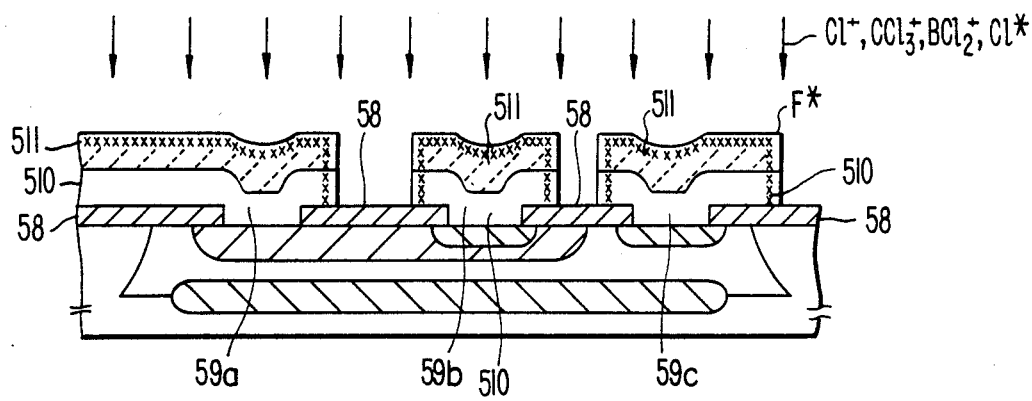

Next, the atmosphere in the etching chamber 61 is changed to a gas mixture of $CCl_4$ and $BCl_3$ at a pressure of about 0.1 Torr. Thus, the second reactive ion etching occurs under the same conditions as in the first reactive ion etching. As a result, the remaining half of the unmasked portion of the aluminum film 510 is etched, up to the surface of the $SiO_2$ insulator layer 50. Thus, the pattern of the aluminum film 510 corresponds to the pattern of the resist mask film 511 as shown in FIG. 5(E).

As mentioned before, the surface of the sidewall formed in the aluminum film 510 during the first reactive ion etching, is protected from the adsorption of active chlorine atoms (Cl*) during the second reactive ion etching because of the layer of the fluorine radicals (F*) which are adsorbed during the plasma exposure process. Therefore, the sidewall surface is protected from further side etching during the second reactive ion etching.

Additionally, adsorption of aluminum chloride ($AlCl_x$) on the surface of the resist mask film 511 during the second reactive ion etching is suppressed by the plasma exposure, as explained below.

Figure 5F:
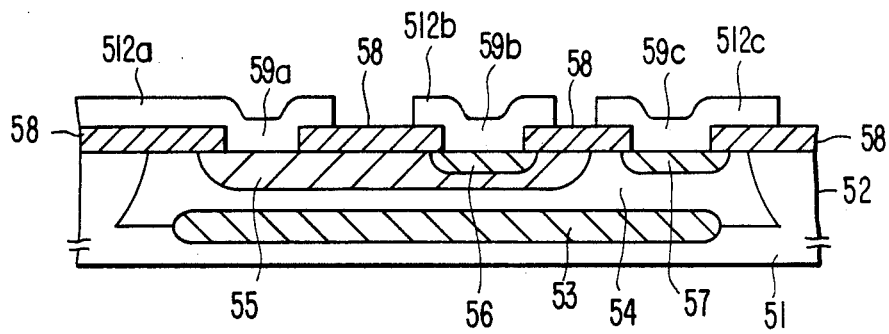

After patterning the aluminum film 510, the substrate is transferred to another plasma exposure system having, for example, a cylindrical chamber. In this chamber, the resist mask film 511 is removed via exposure to oxygen ($O_2$) plasma. Thus, as shown in FIG. 5(F), the aluminum wiring patterns 512a, 512b, and 512c, respectively contact the base region 55, the emitter region 56, and the collector contact region 57 through the associated contact holes, 59a, 59b, and 59c.

While not shown in the attached figures, processing including forming a surface protection insulating layer, etc. is carried out, and the manufacture of a bipolar IC is completed.

The reason for the decrease in adsorption of aluminum chloride on the surface of the resist mask film 511 during the second reactive ion etching is not clear. However, the decrease can be explained via the fluorization of the surface of the resist mask film 511 during the plasma exposure process. That is, the plasma fluorine radicals substitute for the hydrogen atoms on the surface of the resist mask film 511 to form C—F bonds having less ionic properties than C—H bonds. Therefore, the probability of adsorption of ionic molecules like aluminum chloride to the surface of the resist mask film 511 is decreased, and the penetration of the hydrochloric acid into the resist mask film 511 is prevented. As a result, corrosion of the aluminum film by hydrochloric acid, which should be caused when the substrate is exposed in the air just after dry etching using a gas containing chlorine species, is reduced.

When using an Al-Si alloy film, the Si which is segregated during the first reactive ion etching is removed by the plasma exposure using a gas containing fluorine, because the etching rate of the fluorine radical to Si is higher than that of the chloride radical. Accordingly, insufficient electrical isolation due to the residual Si layer or Al layer covered with Si layer can be eliminated by the using the plasma exposure process in a dry etching procedure.

It is obvious that the plasma exposure process using $CF_4$ and $O_2$ is not limited to being employed only once during the course of reactive ion etching as described above. Instead, it may be used during the reactive ion etching process twice or more. Also, the addition of the plasma exposure process prior to and/or subsequent to reactive ion etching enhances the plasma exposure performed in the intermediate stages of reactive ion etching.

The same effect can be also obtained by using plasma exposure employing other fluorine compound gasses including, for example, CHF$_3$, CF$_4$, C$_2$F$_6$, C$_3$F$_8$ or a mixture of either one of CHF$_3$, CF$_4$, C$_2$F$_6$, C$_3$F$_8$ and oxygen or an inert gas.

It is also obvious that this invention can be applied to the patterning of the upper side aluminum wiring layer of a multiple wiring structure.

Moreover, this invention can be effectively applied to forming a wiring pattern on a layer of Al alloy including Al-Si, Al-Cu, etc.

As described above, this invention can provide means for solving the following problems in conventional dry etching techniques for fabricating wiring layers of aluminum film, including an aluminum alloy. That is, the present invention prevents the decrease of the wiring layer width due to side etching, corrosion of the layer, and insufficient electrical isolation between wiring layers due to a residual silicon or aluminum layer. Consequently, this invention enhances the manufacturing yield and reliability of semiconductor devices having high integration density, such as LSIs.

What is claimed is:

1. A process for patterning an aluminum or aluminum alloy wiring layer formed on a semiconductor device, said process comprising the steps of:
    (a) a first dry etching step for selectively removing a part of the aluminum or aluminum alloy wiring layer using a first gas selected as one of chlorine and a chlorine compound;
    (b) exposing the aluminum or aluminum alloy wiring layer to a plasma generated by discharge in a second gas selected as one of fluorine and a fluorine compound; and
    (c) a second dry etching step for selectively removing a further portion of the aluminum or aluminum alloy wiring layer using said first gas.

2. A process for patterning a wiring layer according to claim 1, wherein said first and second dry etching steps are reactive ion etching steps.

3. A process for patterning a wiring layer according to claim 1, wherein steps (b) and (c) are conducted twice or more.

4. A process for patterning a wiring layer according to claim 1, wherein said process further includes the step of:
    prior to step (a), exposing the aluminum or aluminum alloy wiring layer to a plasma generated by discharge in said second gas.

5. A process for patterning a wiring layer according to claim 3, wherein said process further includes the steps of:
    prior to step (a), exposing the aluminum or aluminum alloy wiring layer to a plasma generated by discharge in said second gas; and
    after the final repetition of step (c), exposing the aluminum or aluminum alloy wiring layer to a plasma generated by discharge in said second gas.

6. A process for patterning a wiring layer according to claim 1, wherein said second gas is CHF$_3$, CF$_4$, C$_2$F$_6$, or C$_3$F$_8$.

7. A process for patterning a wiring layer according to claim 6, wherein said second gas includes oxygen.

8. A process for patterning a wiring layer according to claim 6, wherein said second gas includes an inert gas.

9. A process for patterning a wiring layer according to claim 1, wherein said plasma supplies free fluorine radicals.

10. A process for patterning a wiring layer according to claim 9, wherein said free fluorine radicals replace chlorine atoms adsorbed on said device during said first dry etching.

11. A process for patterning a wiring layer formed on a semiconductor device, said process comprising the steps of:
    (a) a first dry etching step for selectively removing a part of the wiring layer using a first gas;
    (b) exposing the wiring layer to a second gas and generating a plasma of the second gas by applying a radio frequency signal to the gas; and
    (c) a second dry etching step for selectively removing a further portion of the wiring layer using said first gas.

12. A process for patterning a wiring layer according to claim 11, wherein said first gas is chlorine or a chlorine compound; and said second gas is fluorine or a fluorine compound.

13. A process for patterning a wiring layer according to claim 11, wherein said first and second dry etching steps are reactive ion etching steps.

14. A process for patterning a wiring layer according to claim 12, wherein said first and second dry etching steps are reactive ion etching steps.

15. A process for patterning a wiring layer according to claim 11, wherein said process further includes the steps of:
    repeating steps (b) and (c) until substantially all of the wiring layer is selectively removed.

16. A process for patterning a wiring layer according to claim 12, wherein said process further comprises the steps of:
    repeating steps (b) and (c) until substantially all of the wiring layer is selectively removed.

17. A process for patterning a wiring layer according to claim 11, wherein said process further includes the step of:
    prior to step (a), exposing the wiring layer to the second gas and generating a plasma of the second gas by applying a radio frequency signal to the second gas.

18. A process for patterning a wiring layer according to claim 12, wherein said process further includes the step of:
    prior to step (a), exposing the wiring layer to the second gas and generating a plasma of the second gas by applying a radio frequency signal to the second gas.

19. A process for patterning a wiring layer according to claim 11, wherein said second gas is CHF$_3$, CF$_4$, C$_2$F$_6$, or C$_3$F$_8$.

20. A process for patterning a wiring layer according to claim 19, wherein said second gas includes oxygen.

21. A process for patterning a wiring layer according to claim 19, wherein said second gas includes an inert gas.

22. A process for patterning a wiring layer according to claim 12, wherein said second gas is CHF$_3$, CF$_4$, C$_2$F$_6$, or C$_3$F$_8$.

23. A process for patterning a wiring layer according to claim 22, wherein said second gas includes oxygen.

24. A process for patterning a wiring layer according to claim 22, wherein said second gas includes an inert gas.

* * * * *